United States Patent
Henspeter et al.

(10) Patent No.: US 11,747,875 B2
(45) Date of Patent: Sep. 5, 2023

(54) DYNAMIC ADJUSTMENT OF POWER SUPPLY RIPPLE RATIO AND FREQUENCY IN VOLTAGE REGULATORS

(71) Applicant: INTERNATIONAL BUSINESS MACHINES CORPORATION, Armonk, NY (US)

(72) Inventors: Justin Henspeter, Kasson, MN (US); Layne A. Berge, Rochester, MN (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 227 days.

(21) Appl. No.: 17/380,591

(22) Filed: Jul. 20, 2021

(65) Prior Publication Data
US 2023/0027702 A1 Jan. 26, 2023

(51) Int. Cl.
*G06F 1/30* (2006.01)
*G11C 5/14* (2006.01)

(52) U.S. Cl.
CPC .............. *G06F 1/305* (2013.01); *G11C 5/147* (2013.01)

(58) Field of Classification Search
CPC ................. G06F 1/305; G11C 5/147
See application file for complete search history.

(56) References Cited

U.S. PATENT DOCUMENTS

| | | |
|---|---|---|
| 8,513,929 B2 | 8/2013 | Drebinger |
| 8,917,069 B2 | 12/2014 | Howes et al. |
| 9,454,168 B2 | 9/2016 | Patel et al. |
| 9,886,048 B2 | 2/2018 | Du et al. |
| 10,877,500 B2 | 12/2020 | Wang et al. |
| 2015/0362936 A1* | 12/2015 | Patel ................. G05F 1/563 323/280 |
| 2016/0204702 A1* | 7/2016 | Padyana ............ H02M 3/1563 323/271 |
| 2020/0408822 A1 | 12/2020 | Rowley |

FOREIGN PATENT DOCUMENTS

WO 2020047200 A1 3/2020

OTHER PUBLICATIONS

Choe et al., "A Low-Dropout Regulator with PSRR Enhancement-through Feed-Forward Ripple Cancellation Techniquein 65 nm CMOS Process", Electronics (online), Jan. 2020; 9(1):146, 10 pages, URL: https://www.mdpi.com/2079-9292/9/1/146/pdf.

\* cited by examiner

Primary Examiner — Mark A Connolly

(57) ABSTRACT

One or more sampling parameters of an application associated with a downstream voltage regulator may be determined. A power supply rejection ratio ("PSRR") and a switching frequency of an upstream voltage regulator may be dynamically adjusted based on the sampling parameters of the application associated with the downstream voltage regulator. The sampling parameters may include a noise level and a workload of the selected application.

20 Claims, 15 Drawing Sheets

PSRR (dB) vs Headroom (V) @ various frequencies

PSRR (dB) vs Frequency (Hz) @ various Headroom voltages

```
┌─────────────────────────────────────────────────────────────┐
│ Determine One Or More Sampling Parameters Of An Application Associated │
│              With A Downstream Voltage Regulator             │
│                             810                              │
│                                                              │
│   ┌──────────────────────────────────────────────────────┐   │
│   │ Determine The Noise Level And The Workload Of The Application Based On │
│   │  An Output Voltage Of The Downstream Voltage Regulator, Wherein The    │
│   │     Downstream Voltage Regulator Is A Low Dropout (LDO) Regulator      │
│   │                           910                            │   │
│   └──────────────────────────────────────────────────────┘   │
└─────────────────────────────────────────────────────────────┘
                                │
                                ▼
┌─────────────────────────────────────────────────────────────┐
│ Dynamically Adjust One Or More Of A Power Supply Rejection Ratio ("PSRR") │
│  And A Switching Frequency Of An Upstream Voltage Regulator Based On The  │
│    One Or More Sampling Parameters Of The Application Associated With A   │
│  Downstream Voltage Regulator, Wherein The Sampling Parameters Include At │
│          Least A Noise Level And A Workload Of The Application            │
│                                820                                        │
└─────────────────────────────────────────────────────────────┘
```

FIG. 9

```
┌─────────────────────────────────────────────────────────────┐
│  Determine One Or More Sampling Parameters Of An            │
│  Application Associated With A Downstream Voltage Regulator │
│                           810                               │
└─────────────────────────────────────────────────────────────┘
                              │
                              ▼
┌─────────────────────────────────────────────────────────────┐
│ Dynamically Adjust One Or More Of A Power Supply Rejection  │
│ Ratio ("PSRR") And A Switching Frequency Of An Upstream     │
│ Voltage Regulator Based On The One Or More Sampling         │
│ Parameters Of The Application Associated With A Downstream  │
│ Voltage Regulator, Wherein The Sampling Parameters Include  │
│ At Least A Noise Level And A Workload Of The Application    │
│                           820                               │
│                                                             │
│  ┌────────────────────────────────────────────────────────┐ │
│  │ Dynamically Adjust The PSRR Of The Upstream Voltage    │ │
│  │ Regulator Based On A Change Of The Workload Of The     │ │
│  │ Application Where A Headroom Of The Upstream Voltage   │ │
│  │ Regulator Is Adjusted For Adjusting The PSRR And The   │ │
│  │ Upstream Voltage Regulator Is An Adjustable Switching  │ │
│  │ Regulator                                              │ │
│  │                      1220                              │ │
│  └────────────────────────────────────────────────────────┘ │
└─────────────────────────────────────────────────────────────┘
```

FIG. 12

```
┌─────────────────────────────────────────────────────────────┐
│  Determine One Or More Sampling Parameters Of An Application Associated With │
│                    A Downstream Voltage Regulator            │
│                              810                             │
└─────────────────────────────────────────────────────────────┘
                              │
                              ▼
┌─────────────────────────────────────────────────────────────┐
│ Dynamically Adjust One Or More Of A Power Supply Rejection Ratio ("PSRR") │
│ And A Switching Frequency Of An Upstream Voltage Regulator Based On The │
│   One Or More Sampling Parameters Of The Application Associated With A │
│ Downstream Voltage Regulator, Wherein The Sampling Parameters Include At │
│         Least A Noise Level And A Workload Of The Application │
│                              820                             │
│  ┌───────────────────────────────────────────────────────┐  │
│  │                                                       │  │
│  │  Dynamically Adjust The Switching Frequency Of The Upstream Voltage │
│  │  Regulator Based On A Change Of The Workload Of The Application  1320 │
│  │                                                       │  │
│  └───────────────────────────────────────────────────────┘  │
└─────────────────────────────────────────────────────────────┘
```

FIG. 13

DYNAMIC ADJUSTMENT OF POWER SUPPLY RIPPLE RATIO AND FREQUENCY IN VOLTAGE REGULATORS

BACKGROUND

The present disclosure relates in general to computing systems, and more particularly, to various embodiments for dynamic adjustment of a power supply rejection ratio ("PSRR") or frequency of voltage regulators in a computing system using a computing processor.

SUMMARY

According to an embodiment of the present disclosure, a method for dynamic adjustment of power supply rejection ratio ("PSRR") or frequency of voltage regulators in an electrical component in a computing system is provided. A PSRR and a switching frequency of an upstream voltage regulator, which may be an adjustable switching regulator, may be dynamically adjusted based on sampling parameters of a selected application associated with a downstream voltage regulator, which may be a low dropout (LDO) regulator. The sampling parameters may include a noise level and a workload (e.g., an output current) of the selected application.

In an additional embodiment, the noise level and the workload of the selected application may be determined based on an output voltage ($V_{out}$) of the downstream voltage regulator. A minimum noise level may be determined based on the workload for the selected application associated with the downstream voltage regulator.

The PSRR, the switching frequency, or both of the upstream voltage regulator may be dynamically adjusted based on the minimum noise level. The PSRR, the switching frequency, or both of the upstream voltage regulator may also be adjusted based on an increase or decrease of the workload of the selected application. The PSRR may also be dynamically adjusted based on a change (e.g., an increase or decrease) in a headroom of the upstream voltage regulator.

An embodiment includes a computer usable program product. The computer usable program product includes a computer-readable storage device, and program instructions stored on the storage device.

An embodiment includes a computer system. The computer system includes a processor, a computer-readable memory, and a computer-readable storage device, and program instructions stored on the storage device for execution by the processor via the memory.

BRIEF DESCRIPTION OF THE DRAWINGS

FIG. 9 sets forth a flow chart illustrating another example method of dynamic adjustment of the PSRR and frequency of voltage regulators based on an application workload in accordance with some embodiments of the present disclosure.

FIG. 12 sets forth a flow chart illustrating another example method of dynamic adjustment of the PSRR and frequency of voltage regulators based on an application workload in accordance with some embodiments of the present disclosure.

FIG. 13 sets forth a flow chart illustrating another example method of dynamic adjustment of the PSRR and frequency of voltage regulators based on an application workload in accordance with some embodiments of the present disclosure.

DETAILED DESCRIPTION OF THE DRAWINGS

Figure 1:
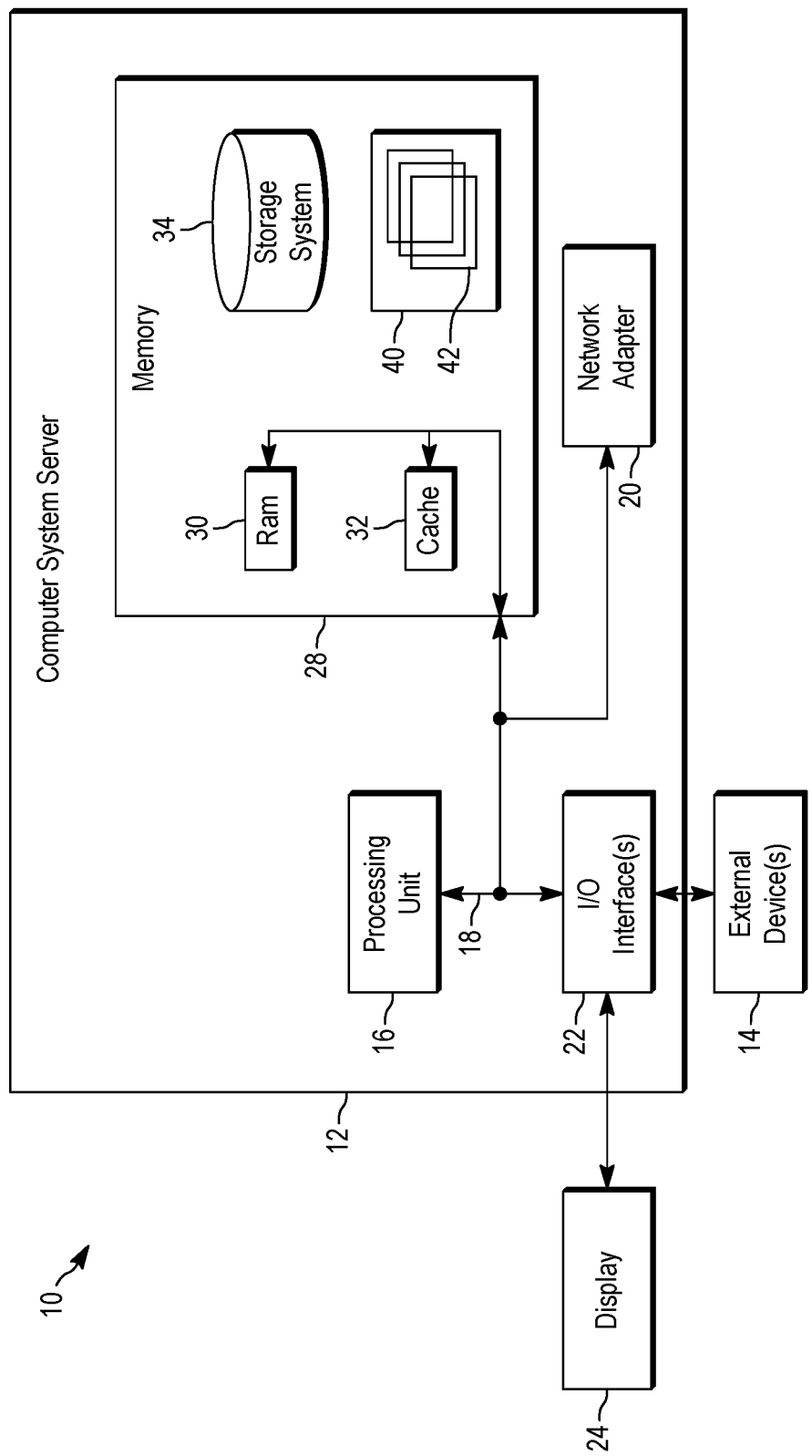
FIG. 1 is a block diagram depicting an exemplary cloud computing node in accordance with some embodiments of the present disclosure.

The present disclosure relates generally to the field of electronic components, and more specifically, to performance or electrical circuits and the like.

In general, a voltage regulator is a circuit that is designed to maintain a constant output voltage level as operating conditions change over time. That is, the voltage regulator may be an electronic device or system designed to receive an input voltage and automatically maintain a constant voltage level on one or more output terminals. Depending on the design, a voltage regulator can be used to regulate one or more alternating current (AC) or direct current (DC) voltages. Voltage regulators can be included in electronic devices such as, for example, computer power supplies where they can be used to stabilize DC voltages used to supply power to electronic components such as processor(s), memory devices, and other types of integrated circuits (ICs). The effectiveness of voltage regulator may be measured by the voltage regulator's power supply rejection ratio ("PSRR"), which measures an amount of noise present on a power supply to the voltage regulator, which is transmitted to a regulated voltage. For example, a low PSRR may reveal a high amount of transmitted noise while a high PSRR indicates a low amount of transmitted noise.

There are several types of voltage regulators such as, for example, switching regulators, linear regulators, and cascaded regulators that may include both switching and linear regulators in a cascaded architecture. One particular type of linear regulator is a low dropout (LDO) regulator. An LDO regulator is a DC linear voltage regulator that may regulate the output voltage even when the supply voltage is close to the output voltage. That is, the LDO regulator may maintain voltage regulation with small differences between supply voltage and load voltage.

Another type of voltage regulator is a buck switching regulator (e.g., a step-down regulator circuit). The buck switching regulator is a type of switch mode power supply circuit designed to efficiently reduce DC voltage from a higher voltage to a lower voltage. Said differently, the buck switching regulator subtracts or "bucks" the supply voltage and reduces the voltage available at the output without changing the polarity.

The choice of the type of regulators mainly depends on the environment or system in which the regulators will be employed. For example, even though switching regulators may be efficient, they can generate a significant amount of noise. As such, a linear regulator may be used in conjunction with the switching regulators due to the low noise performance of the linear regulator. Yet, a challenge with using linear regulators is that in order to generate a desire output voltage, the amount power to account for the difference between the input voltage and the output voltage is dissipated. Thus, the LDO regulator may be selected as the preferred type of linear regulator because of its design feature and characteristic that maximizes power efficiency by minimizing the required input voltage. Also, the LDO regulator may also provide a power supply with low output ripple and an acceptable PSRR.

The power supply rejection ("PSR") is a measurement of the ability of the voltage regulator to reject input voltage ($V_{in}$) variations and the PSRR is a measure of a circuit's PSR expressed as a log ratio of output noise to input noise. Said differently, the PSRR measures a circuits ability to reject ripple of various frequencies that have been provided as the input to the circuit. The ripple may be generated from the input supply or from sharing the input supply between different circuits. It should be noted that in electronics, "noise" is an unwanted disturbance in an electrical signal and may vary based on the electronic devices. More specifically, as used herein, noise refers to any fluctuation, including "ripple", exhibited by the output voltage, usually during steady state operating conditions, but also when changes occur in either the available input line voltage or the output load current draw. Additionally, "power supply noise" is a difference between a local voltage references of a driver and a receiver. For example, noise is a manifestation of parasitic within the power supply that appear as high frequency voltage spikes on the output voltage. Thus, the level of noise may be a frequency level of the voltage spikes on the output voltage.

For the LDO regulator, the PSRR may measure a regulated output voltage ($V_{out}$) ripple in relation to the input voltage ($V_{in}$) ripple based on varies frequencies or range of frequencies. Also, the PSRR of a LDO regulator, at a given frequency, is dependent on the headroom. Headroom is the difference between the input voltage ($V_{in}$) and the output voltage ($V_{out}$) required from the LDO regulator to meet its specifications such as, for example, specifications of the post regulation design as well as its operating frequency and workload (output current).

In radio frequency scenarios, where systems may be sensitive to the output ripple, a switch mode power supply may be employed to provide a higher regulated voltage and take advantage of post regulation to a final voltage setpoint with an LDO regulator in order to the meet specific noise requirements of the system. That is, a switching regulator may be employed and post regulated using an LDO regulator, which may be used in an RF circuit as it relates to power delivery conversion. In this way, the efficiency of the switching regulator is achieved while post regulating the voltage using the LDO regulator to quash unintended noise.

Adjustment of the input voltage $V_{in}$ to the LDO regulator may influence the PSRR at a given frequency and output load. For example, an LDO regulator may exhibit a PSRR of 50 db ("decibels") at a given frequency, the input-to-output voltage difference and load, and exhibit a PSRR of −60 dB at a different frequency, input to output voltage difference and load. Increasing the PSRR at a given workload and frequency by adjusting the input voltage $V_{in}$ (expansion or contraction of LDO headroom) may allow the system to dynamically achieve a more efficient and improved PSRR based on an application's workload.

Accordingly, mechanisms of the illustrated embodiments provide for dynamic tuning or adjusting of the PSRR and frequency of voltage regulators in an electrical component to provide a more efficient and optimized PSRR based on an application's workload. The term 'dynamically' as it is used in this specification refers to occurring in near real-time. For example, in some embodiments PSRR of voltage regulators are adjusted in near real time. "Dynamically" may also refer to occurring at frequent intervals. For example, in some embodiments PSRR of voltage regulators are adjusted at frequent intervals. The frequent intervals may be predetermined. The term 'dynamically' may also refer to occurring upon one or more conditions or changes being present or identified such as, for example, a change in a workload. For example, in some embodiments PSRR of voltage regulators are adjusted in response to a detected change in a workload of an application. The term 'dynamically' may also refer to occurring on demand or as necessary. For example, in some embodiments PSRR of voltage regulators are adjusted on demand or as necessary. As used herein, an application is any operation or system resources (e.g., hardware or software component) that is consuming system resources (e.g., central processing unit, network, I/O, etc.) and power (e.g., voltage or current). A workload may be an amount of work or load (e.g., power load) that is imposed upon an application. For example, an application workload may be related to an amount of time and the amount of computing resources require to perform a task or operation to product an output from provided inputs. The term "switching frequency" may refer to a rate at which the direct current ("DC") voltage is switched on and off during a pulse width modulation process in a switching power supply. For example, a switching frequency in an inverter or converter is a rate at which the switching device is turned on and off. Some switching frequencies range from a few kilohertz ("KHz") to a few megahertz ("MHz") (e.g., 20 Khz-2 MHz).

In some embodiments, "upstream" may refer to the "supply side," provider, or outgoing side. In some embodiments, "downstream" may refer to the "receiving side," receiving, or incoming side. For example, the upstream voltage regulator may be considered as a "source" or supplier such as, for example, being a voltage regulator responsible for providing voltage or current to a downstream voltage regulator. Said differently, the downstream voltage regulator is may be considered as a "source" or supplier such as, for example, being a voltage regulator responsible for providing voltage or current to a downstream voltage regulator.

Some embodiments, described herein, provide for dynamic adjustment of power supply rejection ratio ("PSRR") and the switching frequency of an upstream voltage regulator such as, for example, an adjustable switching regulator, based on sampling parameters of a selected application associated with a downstream voltage regulator such as, for example, the LDO regulator. The PSRR may be adjusted by adjusting the input voltage $V_{in}$ to an upstream voltage regulator. The sampling parameters may include a noise level and a workload of the selected application. The term "sampling parameters" as used in this specification refers to noise levels, workloads, and workload levels. Examples of such sampling parameters include decibel measurements of the noise levels and current, voltage, or switching frequency measurement requirements of a workload. It is to be noted that, in accordance with embodiments of the present disclosure, either or both of PSRR and switching frequency may be adjusted dynamically to achieve the aforementioned efficiency and optimization. In general, power supply noise is a combination of unwanted periodic ripple and spikes combined with random noise from a device or external source. Power supply noise may be referred to as "switching noise," which is a primary source of fluctuation in power supplies and is quantified by a maximum droop or peak in supply voltage with respect to a corresponding nominal value.

In some embodiments, application parameters such as, for example, an output voltage ("$V_{out}1$") and switching frequency ("Fsw") of a digitally adjustable switching regulator may be digitally adjusted via a digital communication bus and post regulates to a desired final voltage through an LDO regulator. In this way, the PSRR may be adjusted. At the output of the LDO, one or more sensing circuits may be used to determine a workload and noise level of a system. Optimization, via the digitally adjustable switch mode power supply parameters (e.g., output voltage and switching frequency) provide for an optimized PSRR at various and changing system workloads. The output voltage of the switch mode power supply, which may feed the LDO (and controls headroom and frequency) may be dynamically adjusted to improve the PSRR of the LDO, which may be sensed at the load, for a given workload.

In general, as used herein, "optimize" may refer to or be defined as "maximize," "minimize," "best," or attain one or more specific targets, objectives, goals, or intentions. Optimize may also refer to maximizing a benefit to a user (e.g., maximize a trained machine learning pipeline/model benefit). Optimize may also refer to making the most effective or functional use of a situation, opportunity, or resource.

Additionally, optimizing need not refer to a best solution or result but may refer to a solution or result that "is good enough" for a particular application, for example. In some implementations, an objective is to suggest a "best" combination of adjusting the PSRR and switching frequencies, but there may be a variety of factors that may result in alternate suggestion of a combination of operations or adjustments. Herein, the term "optimize" may refer to such results based on minima (or maxima, depending on what parameters are considered in the optimization problem). In an additional aspect, the terms "optimize" and "optimizing" may refer to an operation performed in order to achieve an improved result such as reduced execution costs or increased resource utilization, whether or not the optimum result is actually achieved. Similarly, the term "optimize" may refer to a component for performing such an improvement operation, and the term "optimized" may be used to describe the result of such an improvement operation.

It is understood in advance that although this disclosure includes a detailed description on cloud computing, implementation of the teachings recited herein are not limited to a cloud computing environment. Rather, embodiments of the present disclosure are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the disclosure described herein. Regardless, cloud computing node 10 is capable of being implemented and performing any of the functionality set forth hereinabove.

In cloud computing node 10 there is a computer system/server 12, which is operational with numerous other general purpose or special purpose computing system environments or configurations. Examples of well-known computing systems, environments, and configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random-access memory ("RAM") 30 and cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, system memory 28 may include at least one program product having a set (e.g., at least one) of program modules that are configured to carry out the functions of embodiments of the disclosure.

Program/utility 40, having a set (at least one) of program modules 42, may be stored in system memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and methodologies of embodiments of the disclosure as described herein.

Computer system/server 12 may also communicate with one or more external devices 14 such as a keyboard, a pointing device, a display 24, etc.; one or more devices that enable a user to interact with computer system/server 12; and any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and a public network (e.g., the Internet) via network adapter 20. As depicted, network adapter 20 communicates with the other components of computer system/server 12 via bus 18. It should be understood that although not shown, other hardware and software components could be used in conjunction with computer system/server 12. Examples, include, but are not limited to: microcode, device drivers, redundant processing units, external disk drive arrays, RAID systems, tape drives, and data archival storage systems, etc.

Figure 2:
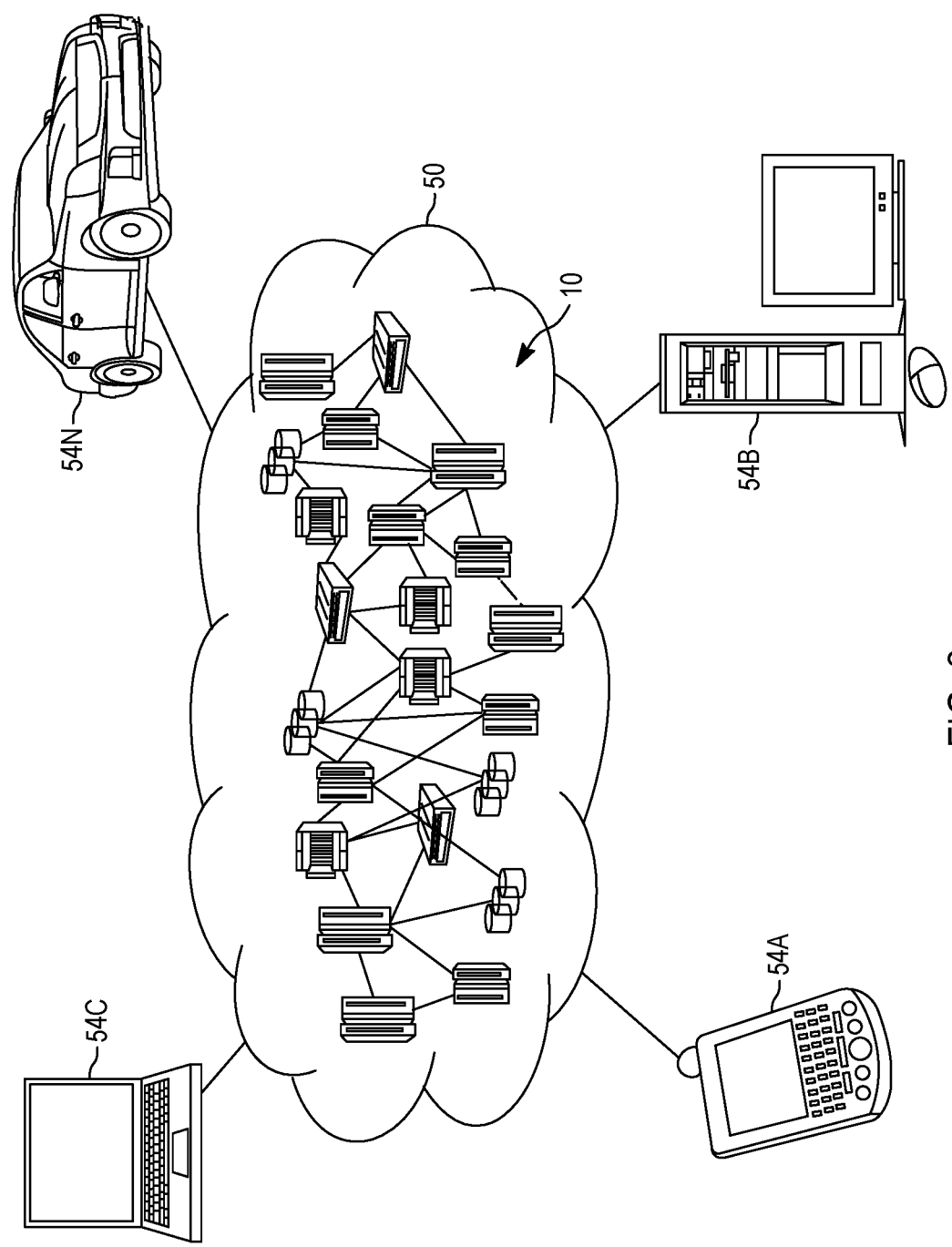
FIG. 2 depicts a cloud computing environment in accordance with some embodiments of the present disclosure.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and network addressable connection (e.g., using a web browser).

Figure 3:
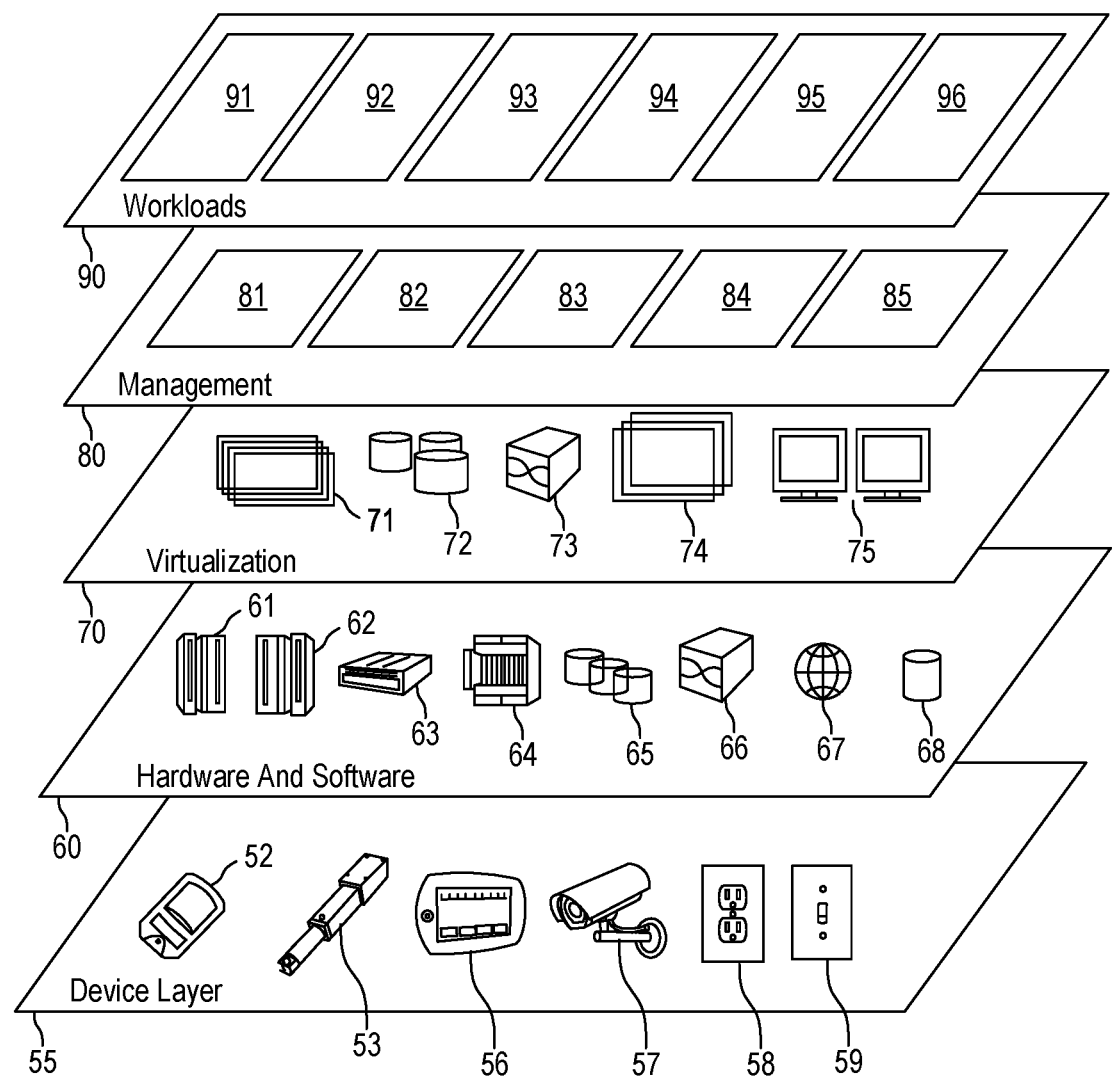
FIG. 3 depicts abstraction model layers in accordance with some embodiments of the present disclosure.

Referring now to FIG. 3, a set of functional abstraction layers provided by cloud computing environment 50 (FIG. 2) is shown. It should be understood that the components, layers, and functions shown in FIG. 3 are intended to be illustrative only and embodiments of the disclosure are not limited thereto. As depicted, the following layers and corresponding functions are provided:

Device layer 55 may include physical devices, virtual devices, or a combination of physical and virtual devices embedded with standalone electronics, sensors, actuators, and other objects to perform various tasks in a cloud computing environment 50. Each of the devices in the device layer 55 incorporates networking capability to other functional abstraction layers such that information obtained from the devices may be provided thereto, and information from the other abstraction layers may be provided to the devices. In one embodiment, the various devices inclusive of the device layer 55 may incorporate a network of entities collectively known as the "internet of things" (IoT). Such a network of entities allows for intercommunication, collection, and dissemination of data to accomplish a great variety of purposes, as one of ordinary skill in the art will appreciate.

Device layer 55 as shown includes sensor 52, actuator 53, "learning" thermostat 56 with integrated processing, sensor, and networking electronics, camera 57, controllable household outlet/receptacle 58, and controllable electrical switch 59 as shown. Other possible devices may include, but are not limited to various additional sensor devices, networking devices, electronics devices (such as a remote-control device), additional actuator devices, so called "smart" appliances such as a refrigerator or washer/dryer, and a wide variety of other possible interconnected objects.

Hardware and software layer 60 includes hardware and software components. Examples of hardware components include: mainframes 61; RISC (Reduced Instruction Set Computer) architecture-based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provides pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and, in the context of the illustrated embodiments of the present disclosure, various workloads and functions 96 for dynamic adjustment of PSRR and frequency of voltage regulators in a computing environment. In addition, workloads and functions 96 for dynamic adjustment of PSRR and frequency of voltage regulators may include such operations as analytics, voltage and switching frequency adjustments, and as will be further described, user and device management functions. One of ordinary skill in the art will appreciate that the workloads and functions 96 for dynamic adjustment of PSRR and frequency of voltage regulators may also work in conjunction with other portions of the various abstractions layers, such as those in hardware and software 60, virtualization 70, management 80, and other workloads 90 (such as data analytics processing 94, for example) to accomplish the various purposes of the illustrated embodiments of the present disclosure.

As previously stated, various embodiments described herein provide novel solutions for dynamic adjustment of a power supply rejection ratio ("PSRR") and frequency of voltage regulators in an electrical component based on the workload/output current of the electrical component or application. The PSRR and the switching frequency of an upstream voltage regulator may be dynamically adjusted based on sampling parameters of a selected application associated with a downstream voltage regulator. The sampling parameters may include a noise level and a workload of the selected application.

Figure 4:
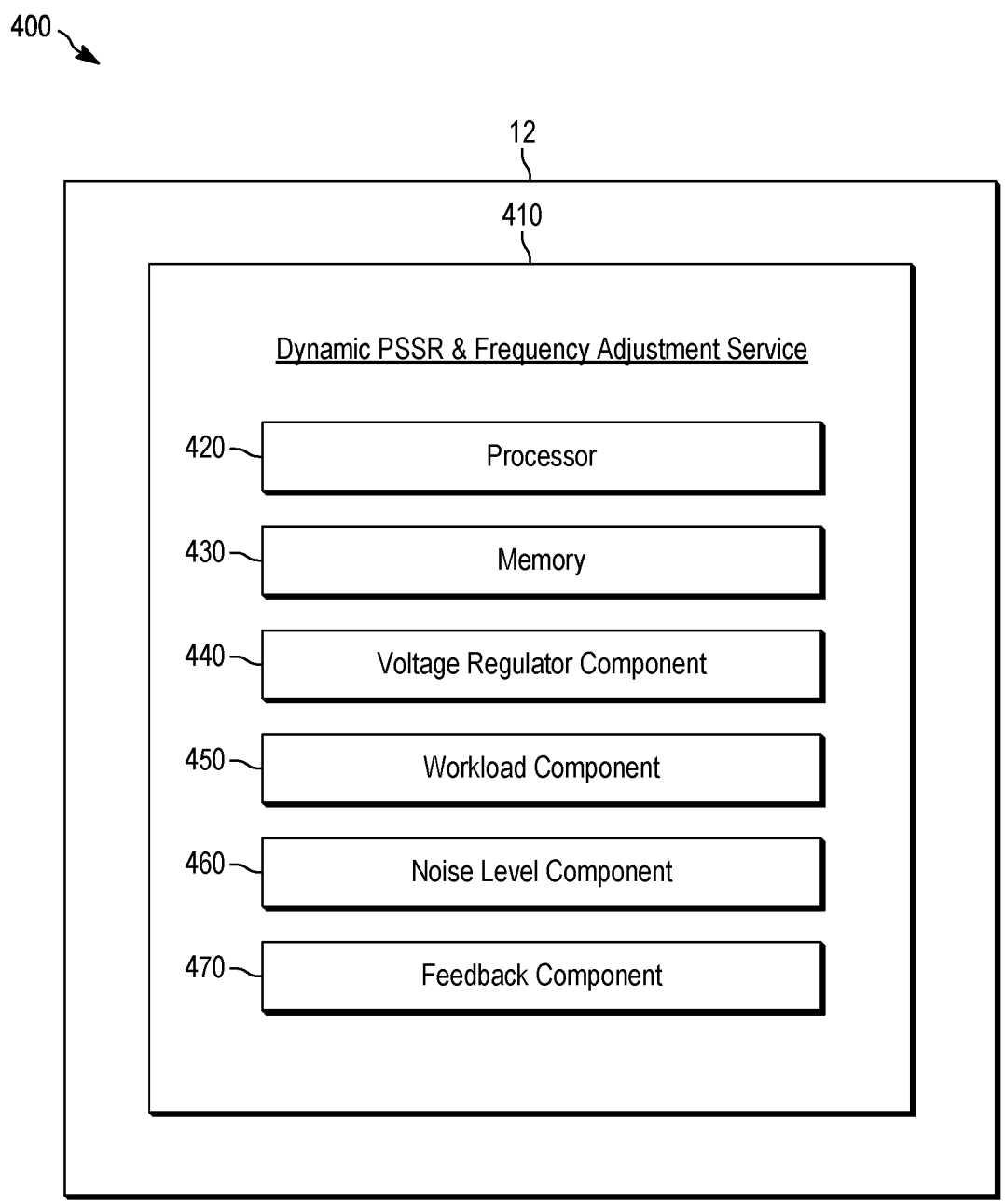
FIG. 4 is an additional block diagram depicting exemplary functional relationships between various aspects of the present disclosure in accordance with some embodiments of the present disclosure.

Turning now to FIG. 4, a block diagram depicting exemplary functional components of a system 400 for dynamic adjustment of PSRR and frequency of voltage regulators based on an application load in a computing environment is shown. In one aspect, one or more of the components, modules, services, applications, and functions described in FIGS. 1-3 may be used in FIG. 4. As will be seen, many of the functional blocks may also be considered "modules" or "components" of functionality, in the same descriptive sense as has been previously described in FIGS. 1-3.

A dynamic PSRR and frequency adjustment service 410 is shown, incorporating processing unit 420 ("processor") to perform various computational, data processing and other functionality in accordance with various aspects of the present disclosure. In one aspect, the processor 420 and memory 430 may be internal and external to the dynamic PSRR and frequency adjustment service 410, and internal and external to the computing system/server 12. The dynamic PSRR and frequency adjustment service 410 may be included and external to the computer system/server 12, as described in FIG. 1. The processing unit 420 may be in communication with the memory 430. The dynamic PSRR and frequency adjustment service 410 may include a voltage regulator component 440, a workload component 450, a noise level component 460, and a feedback component 470.

In one aspect, the system 400 may provide virtualized computing services (i.e., virtualized computing, virtualized storage, virtualized networking, etc.). More specifically, the system 400 may provide virtualized computing, virtualized storage, virtualized networking and other virtualized services that are executing on a hardware substrate.

The dynamic PSRR and frequency adjustment service 410 may dynamically tune and adjust voltage regulators based on an application/electrical component workload. For example, the dynamic PSRR and frequency adjustment service 410, in association with the voltage regulator component 440, may dynamically adjust the PSRR and the switching frequency of an upstream voltage regulator (e.g., an adjustable switching regulator) based on sampling parameters of a selected application associated with a downstream voltage regulator (e.g., an LDO regulator). The sampling parameters may include at least a noise level and a workload of the selected application/electrical component.

The noise level component 460 and the workload component 450 may sample the noise level and the workload of the selected application such as, for example, an electrical circuit, based on an output voltage ($V_{out}$) of the downstream voltage regulator (e.g., the LDO regulator). The noise level component 460 may also determine a minimum noise level based on the workload for the selected application associated with the downstream voltage regulator. Based on the determined noise level, the voltage regulator component 440 may dynamically adjust the PSRR of the upstream voltage regulator (e.g., the adjustable switching regulator) based on the minimum noise level. Alternatively, the voltage regulator component 440 may dynamically adjust the switching frequency upstream voltage regulator based on the minimum noise level. Thus, the voltage regulator component 440 may dynamically adjust both the PSRR and the switching frequency of the upstream voltage regulator based on the minimum noise level.

The voltage regulator component 440 may also dynamically adjust the PSRR and the switching frequency of the upstream voltage regulator based on a change (increase or decrease) of the workload of the selected application. The voltage regulator component 440 may also dynamically adjust the PSRR by increasing or decreasing a headroom of the upstream voltage regulator. In one aspect, the upstream voltage regulator may be an adjustable switching regulator. Dynamically adjusting the PSRR and the switching frequency may include, but not limited to, incrementally increasing, decreasing, altering, or applying various adjustments to the PSRR and the switching frequency.

The feedback component 470 may continuously receive data from the workload component 450 and the noise level component 460. For example, the workload component 450 and the noise level component 460 may dynamically sense, measure, or otherwise determine the noise level and application workload and provide the feedback component 470 with the new data that has been collected and sampled based on the application workload. The feedback component 470 may analyze, processes, and interpret this feedback data and communicate the feedback data to the voltage regulator component 440 for dynamically adjusting the PSRR and the switching frequency.

Figure 5:
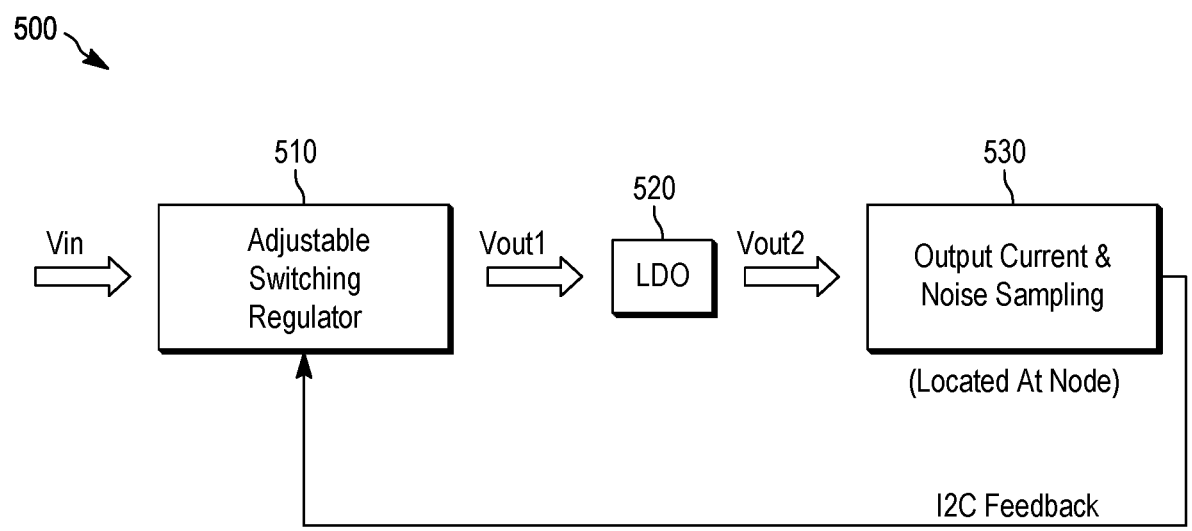
FIG. 5 depicts a block flow diagram depicting operations for dynamic adjustment of a power supply rejection ratio ("PSRR") and frequency of voltage regulators in a computing environment in accordance with some embodiments of the present disclosure.

Turning now to FIG. 5, a block diagram depicts exemplary operations for dynamic adjustment of PSRR and frequency of voltage regulators based on an application load. In one aspect, one or more of the components, modules, services, applications, and functions described in FIGS. 1-4 may be used in FIG. 5. As shown, various blocks of functionality are depicted with arrows designating the blocks' of system 500 relationships with each other and to show process flow (e.g., steps or operations). Additionally, descriptive information is also seen relating each of the functional blocks' of system 500.

As will be seen, many of the functional blocks may also be considered "modules" of functionality, in the same descriptive sense as has been previously described in FIGS. 1-4. Repetitive description of like elements employed in other embodiments described herein is omitted for sake of brevity.

With the foregoing in mind, the module blocks' of system 500 may also be incorporated into various hardware and software components of a system for automatic generation of ground rule verification macros in a computing environment in accordance with the present disclosure. Many of the functional blocks of system 500 may execute as background processes on various components, either in distributed computing components, or elsewhere.

Starting in block 510, a digitally adjustable switching regulator 510 (e.g., a switching buck regulator) is shown receiving an input voltage ($V_{in}$). The output voltage ("$V_{out}1$") of the digitally adjustable switching regulator 510 may be adjusted prior to sending the output voltage ("$V_{out}1$") to an LDO regulator 520. Also, a switching frequency ("Fsw") may be dynamically adjusted by the digitally adjustable switching regulator 510. In one aspect, various power management bus ("PMB") protocols may be used by the digitally adjustable switching regulator 510 to dynamically adjust the output voltage ("$V_{out}1$") and the switching frequency ("Fsw").

Additionally, the dynamic adjustments to the output voltage ("$V_{out}1$") and the switching frequency ("Fsw") performed by the digitally adjustable switching regulator 510 may be based on feedback data of a downstream load such as, for example, an output current ("$I_2C$") and a noise level of output voltage ("$V_{out}2$") of the LDO regulator 520 associated with a workload.

The feedback data may be obtained from sampling parameters of a selected application load associated with a downstream voltage regulator (e.g., the LDO regulator 520) may be collected, analyzed, and processed, as in block 530. For example, the output current and a noise level of an electrical component may be sampled using a sensing circuit (not shown for illustrative convenience), at a particular load based on an output voltage ($V_{out}2$) of the LDO regulator 520.

To further illustrate, assume, for example, an output voltage ("$V_{out}1$") of the digitally adjustable switching regulator is 5.5V and the desired output voltage ("$V_{out}2$") of the LDO regulator 520 is 5 volts (V). The LDO regulator 520 will have a minimum voltage dropout. Also, assume there needs to be difference of 100 millivolts (mV) between the output voltage ("$V_{out}1$") of the digitally adjustable switching regulator 510 and the desired output voltage ("$V_{out}2$") of the LDO regulator 520 based on a given load of an electrical circuit.

In operation, the 5.5V output voltage ("$V_{out}1$") of the digitally adjustable switching regulator 510 is passed to the LDO regulator 520. The LDO regulator drops the 5.5V output voltage ("$V_{out}1$") down to the post regulated 5V, which is now the desired output voltage ("$V_{out}2$") of 5V. The workload and the noise level may increase and decrease based on the post regulated 5V provided to the electrical component. A sampling of the workload and output current may be collected, analyzed, and provided as feedback to the digitally adjustable switching regulator 510, which may, again, dynamically adjust the PSRR and switching frequency based on the increase or decrease to the workload, the noise level, or both.

Figure 6A:
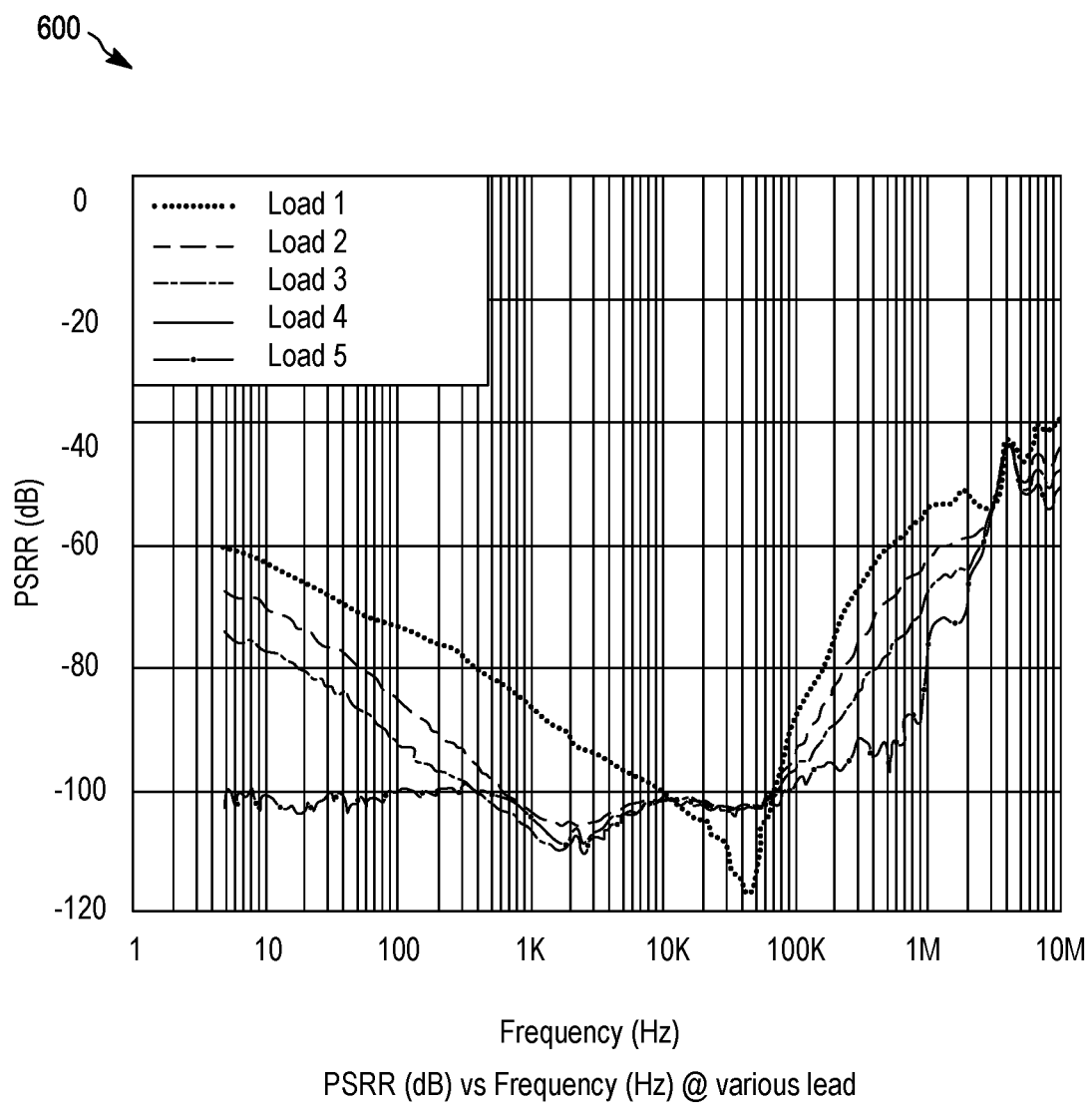
FIGS. 6A-6C depict graph diagrams illustrating comparisons between the PSRR and frequency, PSRR and headroom at various frequencies, and PSRR and frequency at various headroom voltages in accordance with some embodiments of the present disclosure.
Figure 6B:
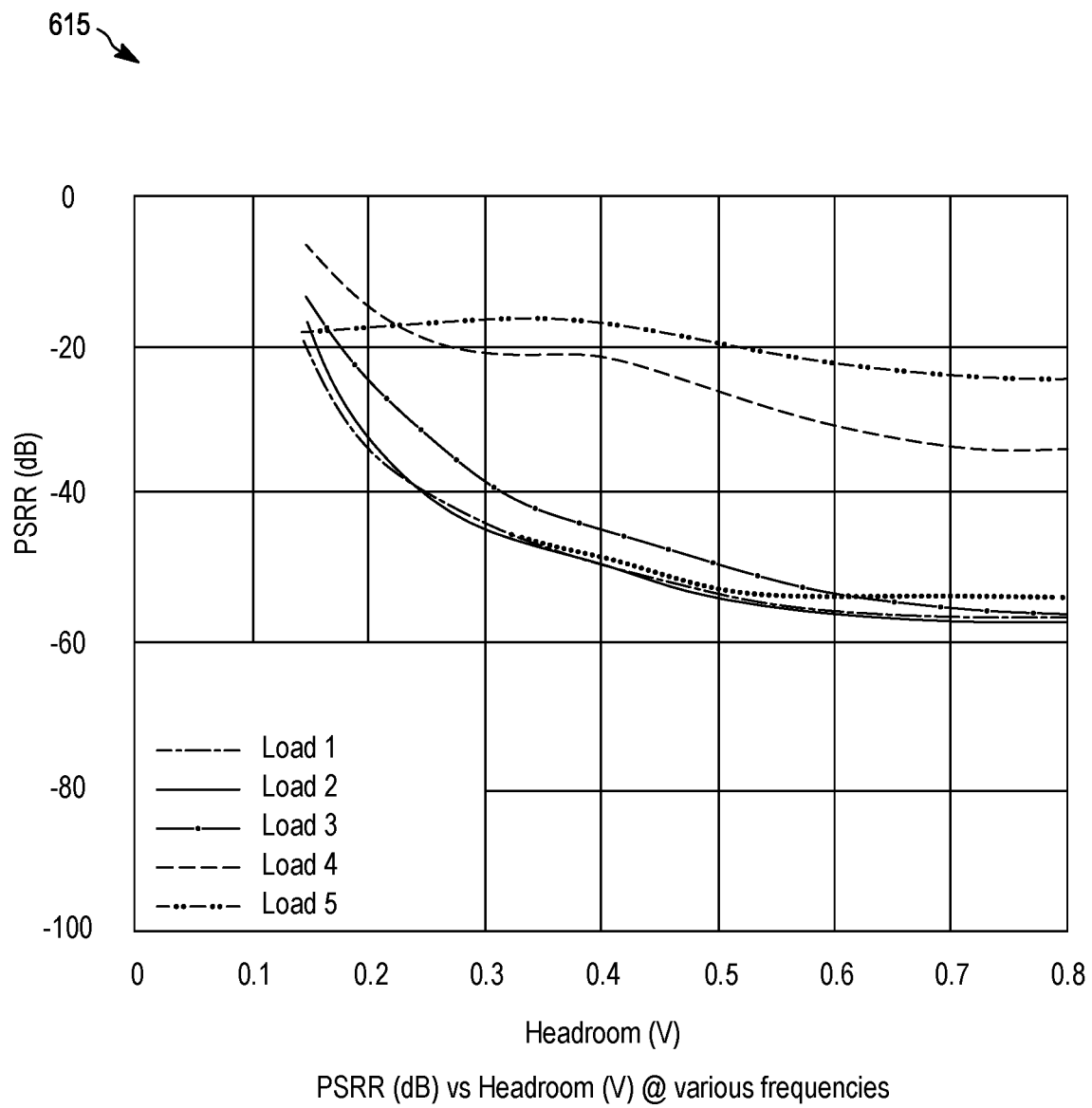
Figure 6C:
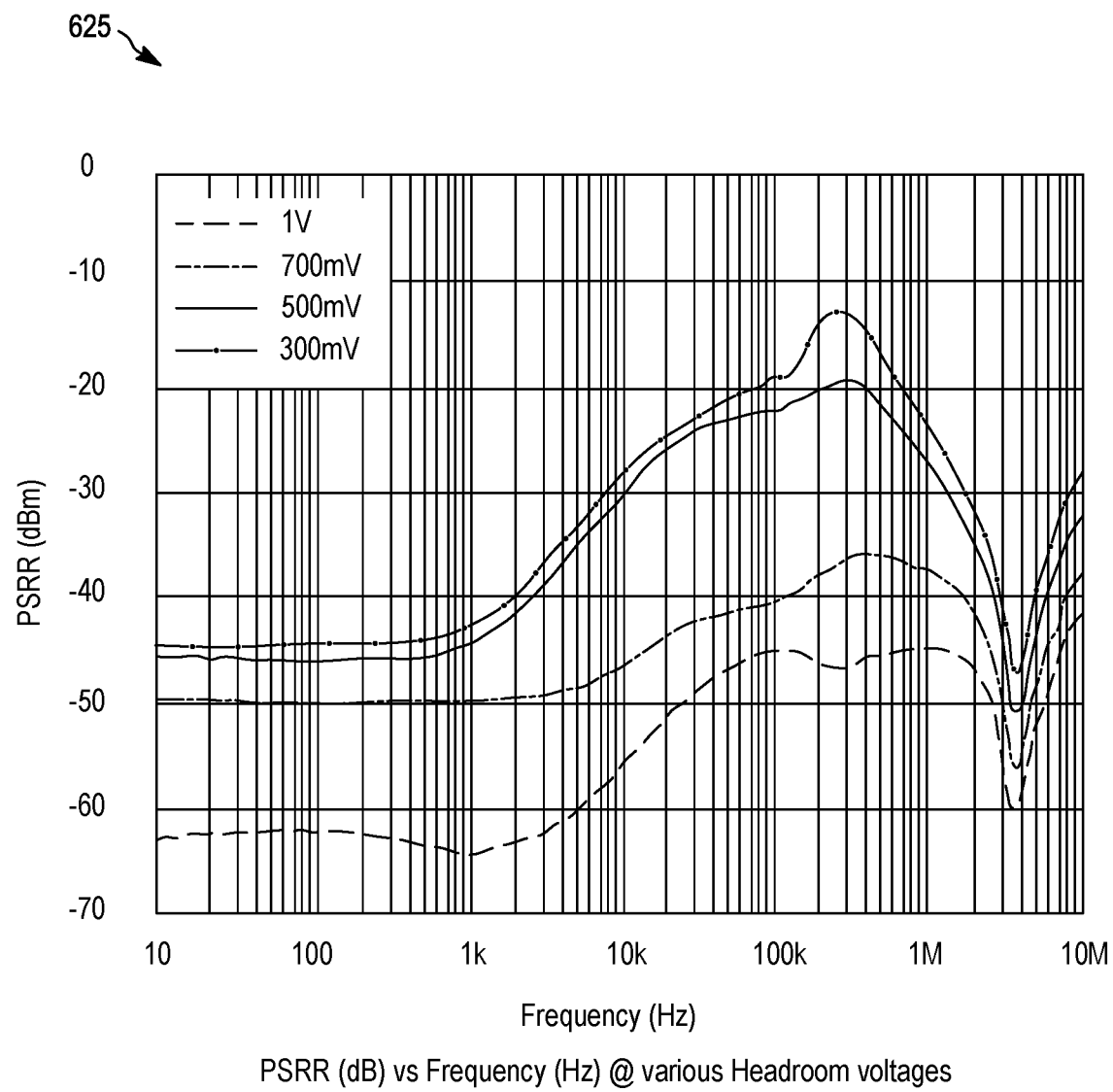

Turning now to FIGS. 6A-6C, graphs 600, 615, and 625 depicts comparison between the PSRR and frequency, PSRR and headroom at various frequencies, and PSRR and frequency at various headroom voltages. The illustrative comparisons depict various results that may impact the dynamic adjustments of voltage regulators as described herein. More specifically, the results may be taken at the workload of an electrical component and be used as feedback data to be analyzed and processed for dynamically adjust the PSRR, the switching frequency, or a combination thereof.

Turning now to FIG. 6A, graph 600 illustrates the comparison between the PSRR and frequency where the PSRR is a function of the load current. Graph 600 depicts the PSRR (db) on the Y-axis while the X-axis illustrates the frequency ("Hertz" or Hz) from 1 to 10M hertz. Various current loads are illustrated for Load 1-N of various currents. Also, for graphs 600, 615, for illustration purposes only, it may be assumed that the input voltage ($V_{in}$) of an LDO regulator is 6.5V and the output voltage ($V_{out}$) is 5V.

As illustrated, the load current for each of the loads such as, for example, loads 1-n, may affect the PSRR. As the PSRR is reduced (e.g., lower on the dB scale of the Y-axis in relation to the PSRR), the more efficient the LDO regulator is at rejecting noise.

Depending on where the voltage is set and adjusted for a digitally adjustable switching regulator, the PSRR may be affected and may influence the input voltage to the LDO regulator, particularly for electronic components that may be acutely sensitive to noise. Thus, the PSRR can fall dramatically as the load current rises or the PSRR can increase as the load current decreases. As the load increases from a lower current (e.g., load 2) to a higher current (e.g., load 1), the PSRR of the workload application may decrease such as, for example, by 20 dB at 1 kHz. At high frequencies, the PSSR may increase. In general, the PSRR at smaller workloads may be more efficient than it is at heavy loads.

It should also be noted that the PSRR is also a function of the input-to-output voltage differential, or the headroom (e.g., the difference between the input and output voltages) ranging from 0 to 0.8 volts ("V"), such as shown in FIG. 6B. For a fixed headroom voltage, the PSRR decreases as the load current increases and the PSRR increases as the load decreases. As the headroom voltage decreases, the PSRR decreases. As the load current increases, the PSRR may decrease. The smaller the headroom voltage, the more dramatic the reduction in gain. As the headroom voltage continues to decrease, the PSRR may also continue to decrease.

Additionally, as illustrated in FIG. 6C, a comparison between the PSRR and the frequency at various headroom voltages. For example, the PSRR for a workload is depicted at 300-millivolts ("mV"), 500-mV, 700-mV and 1-V headroom voltages. As the headroom voltage decreases, the PSRR decreases. For example, at 100 kHz, changing the headroom voltage from 1 V to 700 mV results in a 5-dB decrease in PSRR. However, a smaller change in headroom voltage, from 700 mV to 500 mV, causes the PSRR almost 20 dB.

Figure 7:
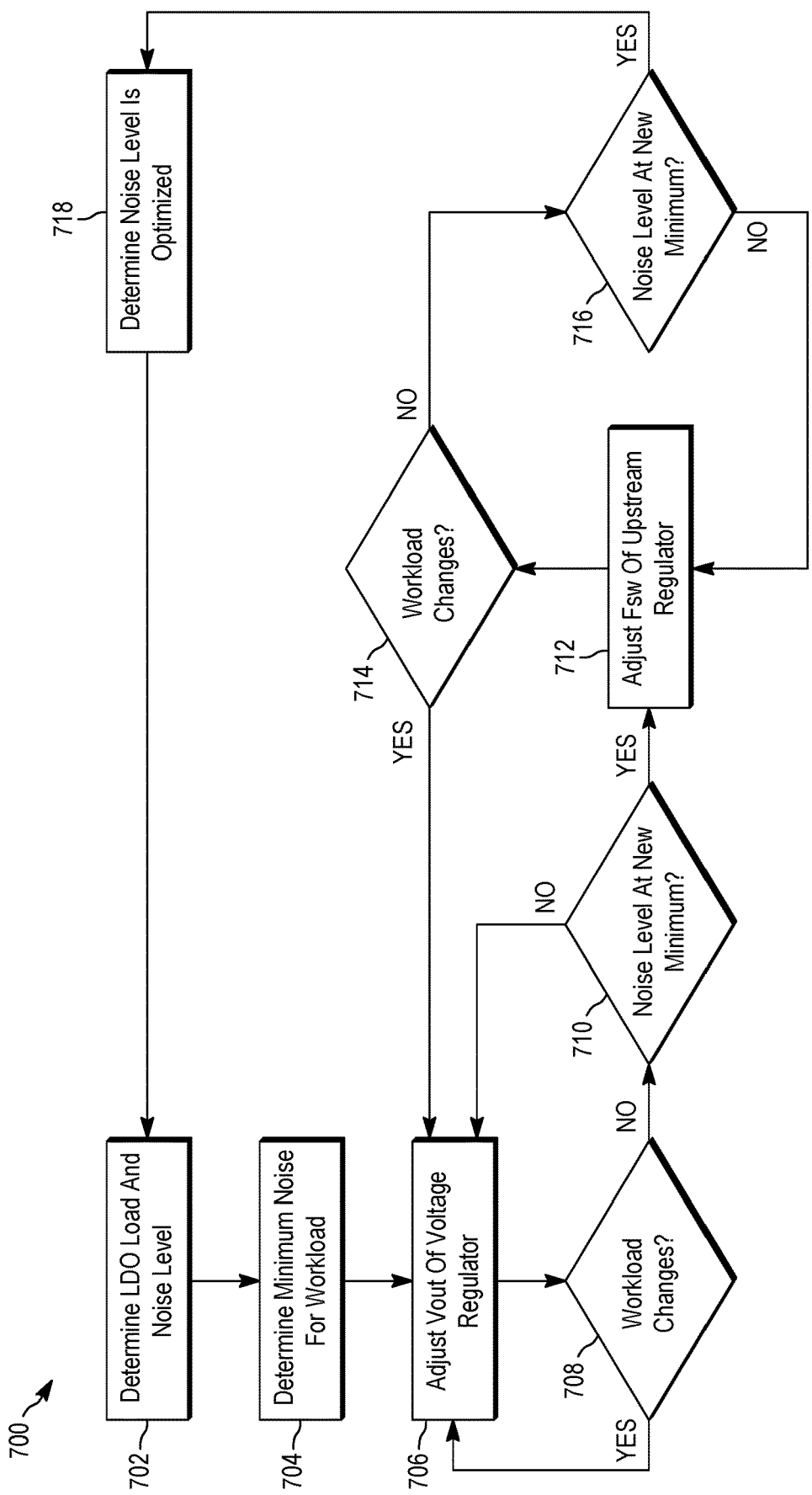
FIG. 7 is a flowchart depicting an additional exemplary method for dynamic adjustment of the PSRR and frequency of voltage regulators based on an application workload in a computing environment, by a processor, in accordance with some embodiments of the present disclosure.

Turning now to FIG. 7, a method 700 for dynamic adjustment of a power supply rejection ratio ("PSRR") and frequency of voltage regulators based on an application workload of an integrated circuit in a computing environment using a processor is depicted, in which various aspects of the illustrated embodiments may be implemented. The functionality 700 may be implemented as a method (e.g., a computer-implemented method) executed as instructions on a machine, where the instructions are included on at least one computer readable medium or one non-transitory machine-readable storage medium.

The functionality of method 700 may start, in block 702, by determining/measuring a workload ("load") and a noise level on an application (e.g., an electrical component) associated with a low dropout (LDO) regulator. A minimum noise level may be determined based on the workload of the application, as in block 704.

An output voltage ($V_{out}$) of a voltage regulator (e.g., an upstream voltage regulator) such as, for example, an adjustable switching "buck" regulator may be dynamically adjusted, as in block 706.

A determination operation may be performed to determine whether the workload has changed, as in block 708. If yes at block 708, the operations of method 700 may return to block 706.

If no at block 708, a determination operation may be performed to determine whether there is noise at the minimum noise level, as in block 710. If no at block 710, the operations of method 700 may return to block 706. If yes at block 710, a switching frequency ("Fsw") of the voltage regulator (e.g., the upstream voltage regulator/the adjustable switching "buck" regulator) may be dynamically adjusted, as in block 712.

Again, a determination operation may be performed to determine whether the workload has changed, as in block 714. If yes at block 714, the operations of method 700 may return to block 706. If no at block 714, a determination operation may be performed to determine whether there is noise at the minimum noise level, as in block 716. If no at block 716, the operations of method 700 may return to block 712. If yes at block 716, the operations of method 700 may be move to block 718.

At block 718, the noise level for the workload of the application is determined to be optimized. For example, the "optimized noise" may be defined value, a value within a range of acceptable noise parameters, a percentage, and below a noise level threshold. The functionality 700 may end, as at block 718, or return back to block 702.

Figure 8:
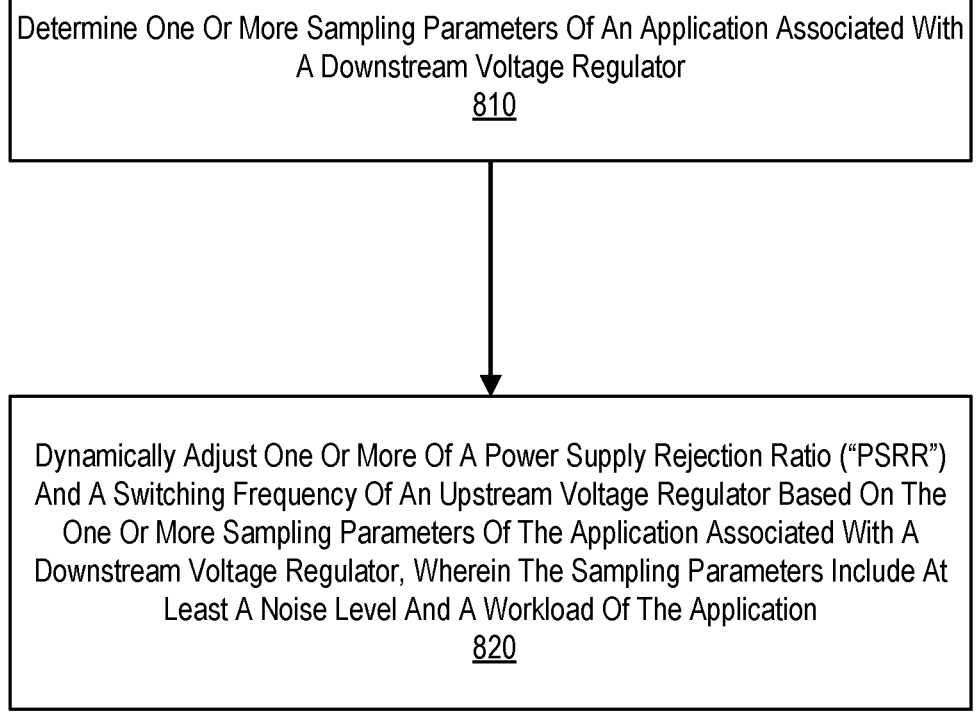
FIG. 8 is an additional flowchart diagram depicting an additional exemplary method for dynamic adjustment of the PSRR and frequency of voltage regulators based on an application workload in a computing environment, by a processor, again in which aspects of the present disclosure may be realized.

For further explanation, FIG. 8 sets forth a flow chart illustrating an example method of dynamic adjustment of a power supply rejection ratio ("PSRR") and frequency of voltage regulators based on an application workload of an integrated circuit in accordance with some embodiments of the present disclosure. The example method of FIG. 8 includes determining 810 one or more sampling parameters of an application associated with a downstream voltage regulator. In some embodiments, the sampling parameters may include, but not limited to, a noise level and workload/output current of the application such as, for example, an electrical component or circuit.

The example method of FIG. 8 also includes dynamically adjusting 820 one or more of a power supply rejection ratio ("PSRR") and a switching frequency of an upstream voltage regulator based on the one or more sampling parameters of the application associated with the downstream voltage regulator. In some embodiments, the upstream voltage regulator may be an adjustable switching regulator. In some embodiments, the downstream voltage regulator is a low dropout (LDO) regulator. In some embodiments, the LDO regulator is a DC linear voltage regulator that may regulate the output voltage even when the supply voltage (from the upstream voltage regulator) is close to the output voltage. That is, the LDO regulator may maintain voltage regulation with small differences between supply voltage and load voltage.

For further explanation, FIG. 9 sets forth a flow chart illustrating an example method of dynamic adjustment of a PSRR and frequency of voltage regulators based on an application workload of an integrated circuit in accordance with some embodiments of the present disclosure. Like the example method of FIG. 8, the example method of FIG. 9 also includes determining 810 one or more sampling parameters of an application associated with a downstream voltage regulator; and dynamically adjusting 820 one or more of a PSRR and a switching frequency of an upstream voltage regulator based on the one or more sampling parameters of the application associated with the downstream voltage regulator, wherein the sampling parameters include at least a noise level and a workload of the application.

The example method of FIG. 9 also includes determining a noise level and the workload of the application based on an output voltage of the downstream voltage regulator. For example, the noise level and the workload of an electrical circuit may be determined by measuring or sensing an output voltage ($V_{out}$) of a downstream voltage regulator (e.g., the LDO regulator) based on a supply voltage provided from an upstream voltage regulator.

Figure 10:
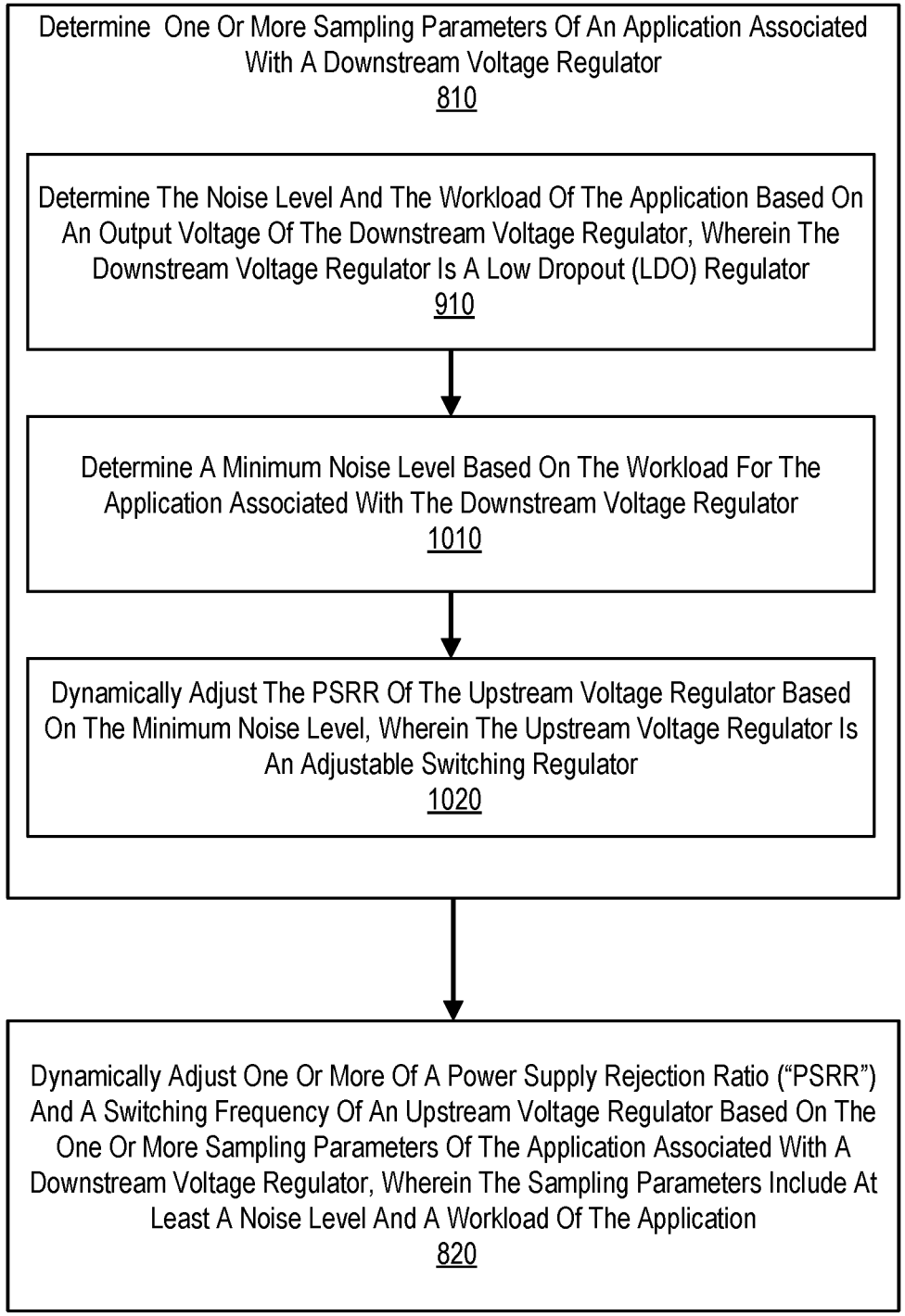
FIG. 10 sets forth a flow chart illustrating another example method of dynamic adjustment of the PSRR and frequency of voltage regulators based on an application workload in accordance with some embodiments of the present disclosure.

For further explanation, FIG. 10 sets forth a flow chart illustrating an example method of dynamic adjustment of a PSRR and frequency of voltage regulators based on an application workload of an integrated circuit in accordance with some embodiments of the present disclosure. Like the example method of FIG. 8, the example method of FIG. 10 also includes determining 810 one or more sampling parameters of an application associated with a downstream voltage regulator; and dynamically adjusting 820 one or more of a PSRR and a switching frequency of an upstream voltage regulator based on the one or more sampling parameters of the application associated with the downstream voltage regulator, wherein the sampling parameters include at least a noise level and a workload of the application.

The example method of FIG. 10 also includes determining 910 the noise level and the workload of the application based on an output voltage of the downstream voltage regulator. The example method of FIG. 10 also includes determining 1010 a minimum noise level based on the workload for the application associated with the downstream voltage regulator. The example method of FIG. 10 also includes dynamically adjusting 1020 the PSRR of the upstream voltage regulator based on the minimum noise level, wherein the upstream voltage regulator is an adjustable switching regulator.

For example, a minimum noise level may be based on the workload for the application associated with the low dropout (LDO) regulator and then dynamically adjust (in near real time) the PSRR of the adjustable switching regulator based on the minimum noise level.

Figure 11:
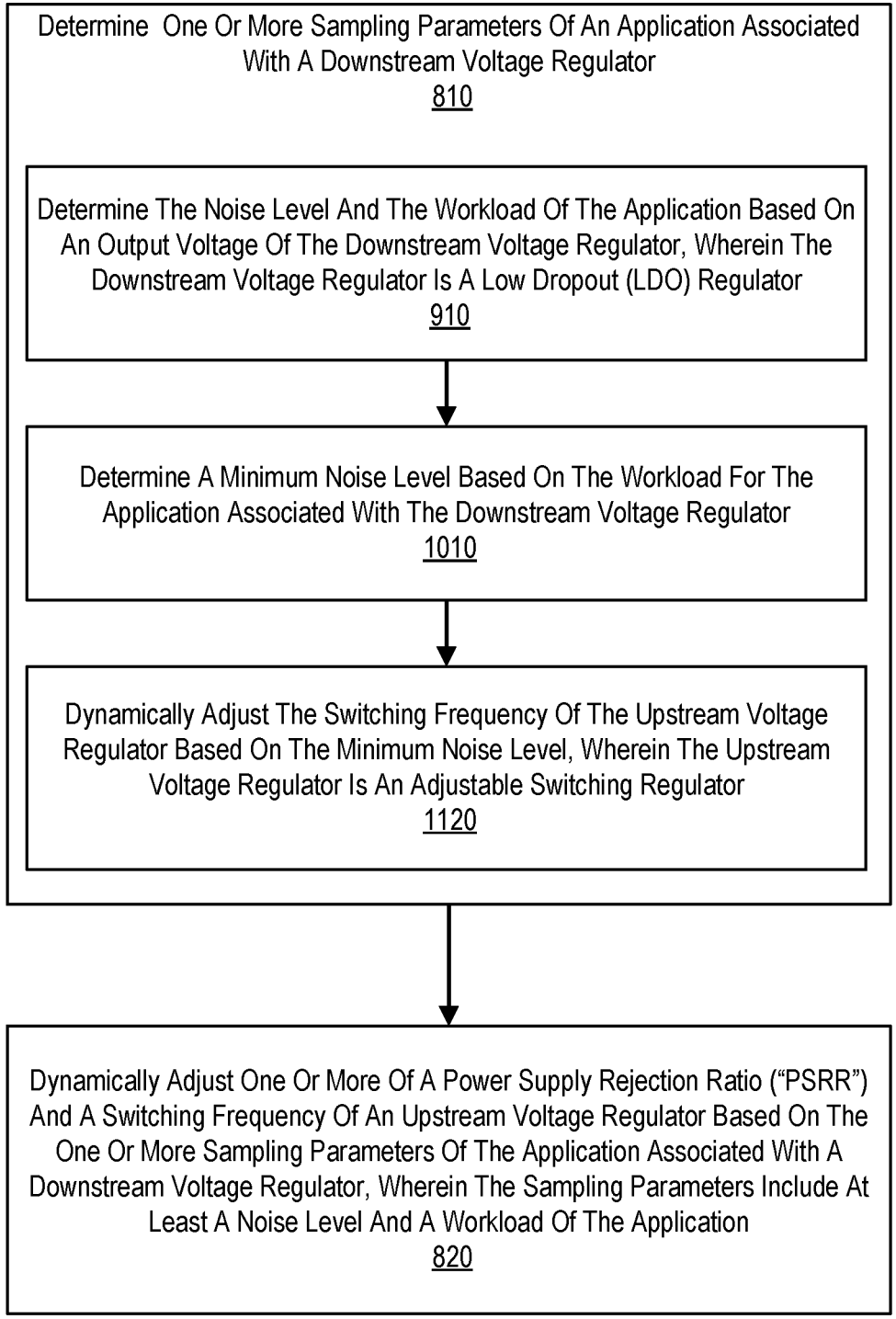
FIG. 11 sets forth a flow chart illustrating another example method of dynamic adjustment of the PSRR and frequency of voltage regulators based on an application workload in accordance with some embodiments of the present disclosure.

For further explanation, FIG. 11 sets forth a flow chart illustrating an example method of dynamic adjustment of a PSRR and frequency of voltage regulators based on an application workload of an integrated circuit in accordance with some embodiments of the present disclosure. Like the example method of FIG. 8, the example method of FIG. 11 also includes determining 810 one or more sampling parameters of an application associated with a downstream voltage regulator; and dynamically adjusting 820 one or more of a PSRR and a switching frequency of an upstream voltage regulator based on the one or more sampling parameters of the application associated with the downstream voltage regulator, wherein the sampling parameters include at least a noise level and a workload of the application.

The example method of FIG. 11 also includes determining 910 the noise level and the workload of the application based on an output voltage of the downstream voltage regulator. The example method of FIG. 11 also includes determining 1010 a minimum noise level based on the workload for the application associated with the downstream voltage regulator.

The example method of FIG. 11 also includes dynamically adjusting 1120 the switching frequency of the upstream voltage regulator based on the minimum noise level, wherein the upstream voltage regulator is an adjustable switching regulator. For example, a minimum noise level may be based on the workload for the application associated with the low dropout (LDO) regulator and then dynamically adjust (in near real time) the switching frequency of the adjustable switching regulator based on the minimum noise level.

For further explanation, FIG. 12 sets forth a flow chart illustrating an example method of dynamic adjustment of a PSRR and frequency of voltage regulators based on an application workload of an integrated circuit in accordance with some embodiments of the present disclosure. Like the example method of FIG. 8, the example method of FIG. 12 also includes determining 810 one or more sampling parameters of an application associated with a downstream voltage regulator; and dynamically adjusting 820 one or more of a PSRR and a switching frequency of an upstream voltage regulator based on the one or more sampling parameters of the application associated with the downstream voltage regulator, wherein the sampling parameters include at least a noise level and a workload of the application. The example method of FIG. 12 also includes dynamically adjusting 1220 the PSRR of the upstream voltage regulator based on a change of the workload of the application where a headroom of the upstream voltage regulator is adjusted for adjusting the PSRR and the upstream voltage regulator is an adjustable switching regulator.

For further explanation, FIG. 13 sets forth a flow chart illustrating an example method of dynamic adjustment of a PSRR and frequency of voltage regulators based on an application workload of an integrated circuit in accordance with some embodiments of the present disclosure. Like the example method of FIG. 8, the example method of FIG. 13 also includes determining 810 one or more sampling parameters of an application associated with a downstream voltage regulator; and dynamically adjusting 820 one or more of a PSRR and a switching frequency of an upstream voltage regulator based on the one or more sampling parameters of the application associated with the downstream voltage regulator, wherein the sampling parameters include at least a noise level and a workload of the application. The example method of FIG. 13 also includes dynamically adjusting 1320 the switching frequency of the upstream voltage regulator based on a change of the workload of the application.

It should be noted that the workload and the noise level may change (e.g., increase and decrease) based on a post regulated voltage (e.g., 5V) provided to an electrical component. A sampling of the workload and output current may be collected, analyzed, and provided as feedback for dynamically adjusting either or both of PSRR and switching frequency based on the increase or decrease to the workload, the noise level, or both. The noise level for the workload of the application is determined to be optimized. For example, the "optimized noise" may be defined value, a value within a range of acceptable noise parameters, a percentage, and below a noise level threshold.

The present disclosure may be a system, a method, or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and a wireless network. The network may comprise copper transmission cables, optical transmission fibers, wireless transmission, routers, firewalls, switches, gateway computers and edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and block diagrams of methods, apparatus (systems), and computer program products according to embodiments of the disclosure. It will be understood that each block of the flowchart illustrations and block diagrams, and combinations of blocks in the flowchart illustrations and block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowcharts and block diagram block or blocks. These computer readable program instructions may also be stored in a computer readable storage medium that can direct a computer, a programmable data processing apparatus, and other devices to function in a particular manner, such that the computer readable storage medium having instructions stored therein comprises an article of manufacture including instructions which implement aspects of the function/act specified in the flowcharts and block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowcharts and block diagram block or blocks.

The flowcharts and block diagrams in the Figures illustrate the architecture, functionality, and operation of possible implementations of systems, methods, and computer program products according to various embodiments of the present disclosure. In this regard, each block in the flowcharts or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and flowchart illustrations, and combinations of blocks in the block diagrams and flowchart illustrations, can be implemented by special purpose hardware-based systems that perform the specified functions or acts or carry out combinations of special purpose hardware and computer instructions.

The descriptions of the embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for dynamic tuning of voltage regulators in a computing environment, the method comprising:
    determining one or more sampling parameters of an application associated with a downstream voltage regulator; and
    dynamically adjusting one or more of a power supply rejection ratio ("PSRR") and a switching frequency of an upstream voltage regulator based on the one or more sampling parameters of the application associated with the downstream voltage regulator, wherein the sampling parameters include at least a noise level and a workload of the application.

2. The method of claim 1, further comprising determining a noise level and the workload of the application based on an output voltage of the downstream voltage regulator, wherein the downstream voltage regulator is a low dropout (LDO) regulator.

3. The method of claim 1, further including determining a minimum noise level based on the workload for the application associated with the downstream voltage regulator.

4. The method of claim 3, further including dynamically adjusting the PSRR of the upstream voltage regulator based on the minimum noise level, wherein the upstream voltage regulator is an adjustable switching regulator.

5. The method of claim 3, further including dynamically adjusting the switching frequency of the upstream voltage regulator based on the minimum noise level, wherein the upstream voltage regulator is an adjustable switching regulator.

6. The method of claim 1, further including dynamically adjusting the PSRR of the upstream voltage regulator based on a change of the workload of the application, wherein a headroom of the upstream voltage regulator is adjusted for adjusting the PSRR and the upstream voltage regulator is an adjustable switching regulator.

7. The method of claim 1, further including dynamically adjusting the switching frequency of the upstream voltage regulator based on a change of the workload of the application.

8. A system for dynamic tuning of voltage regulators in a computing environment, comprising one or more computers with executable instructions that when executing cause the system to:
    determining one or more sampling parameters of an application associated with a downstream voltage regulator; and
    dynamically adjusting one or more of a power supply rejection ratio ("PSRR") and a switching frequency of an upstream voltage regulator based on the one or more sampling parameters of the application associated with the downstream voltage regulator, wherein the sampling parameters include at least a noise level and a workload of the application.

9. The system of claim 8, wherein the executable instructions when executed cause the system to determine the noise level and the workload of the application based on an output voltage of the downstream voltage regulator, wherein the downstream voltage regulator is a low dropout (LDO) regulator.

10. The system of claim 8, wherein the executable instructions when executed cause the system to determine a minimum noise level based on the workload for the application associated with the downstream voltage regulator.

11. The system of claim 10, wherein the executable instructions when executed cause the system to dynamically adjust the PSRR of the upstream voltage regulator based on the minimum noise level, wherein the upstream voltage regulator is an adjustable switching regulator.

12. The system of claim 10, wherein the executable instructions when executed cause the system to dynamically adjust the switching frequency of the upstream voltage regulator based on the minimum noise level, wherein the upstream voltage regulator is an adjustable switching regulator.

13. The system of claim 8, wherein the executable instructions when executed cause the system to dynamically adjust the PSRR of the upstream voltage regulator based on a change of the workload of the application, wherein a headroom of the upstream voltage regulator is adjusted for adjusting the PSRR and the upstream voltage regulator is an adjustable switching regulator.

14. The system of claim 8, wherein the executable instructions when executed cause the system to dynamically adjust the switching frequency of the upstream voltage regulator based on a change of the workload of the application.

15. A computer program product for dynamic tuning of voltage regulators in a computing environment, the computer program product comprising one or more computer readable storage media, and program instructions collectively stored on the one or more computer readable storage media, the program instruction comprising:
    program instructions to determining one or more sampling parameters of an application associated with a downstream voltage regulator; and
    program instructions to dynamically adjusting one or more of a power supply rejection ratio ("PSRR") and a switching frequency of an upstream voltage regulator based on the one or more sampling parameters of the application associated with the downstream voltage regulator, wherein the sampling parameters include at least a noise level and a workload of the application.

16. The computer program product of claim 15, further including program instructions to determine the noise level and the workload of the application based on an output voltage ($V_{out}$) of the downstream voltage regulator, wherein the downstream voltage regulator is a low dropout (LDO) regulator.

17. The computer program product of claim 15, further including program instructions to determine a minimum noise level based on the workload for the application associated with the downstream voltage regulator.

18. The computer program product of claim 17, further including program instructions to dynamically adjust the PSRR of the upstream voltage regulator based on the minimum noise level, wherein the upstream voltage regulator is an adjustable switching regulator.

19. The computer program product of claim 17, further including program instructions to dynamically adjust the switching frequency of the upstream voltage regulator based on the minimum noise level, wherein the upstream voltage regulator is an adjustable switching regulator.

20. The computer program product of claim 15, further including program instructions to:
dynamically adjust the PSRR of the upstream voltage regulator based on a change of the workload of the application, wherein a headroom of the upstream voltage regulator is adjusted for adjusting the PSRR and the upstream voltage regulator is an adjustable switching regulator; and
dynamically adjust the switching frequency of the upstream voltage regulator based on a change of the workload of the application.

\* \* \* \* \*